(12) United States Patent
Nakatani et al.

(10) Patent No.: US 10,964,513 B2
(45) Date of Patent: Mar. 30, 2021

(54) PLASMA PROCESSING APPARATUS

(71) Applicant: HITACHI HIGH-TECH CORPORATION, Tokyo (JP)

(72) Inventors: Shintarou Nakatani, Tokyo (JP); Tsunehiko Tsubone, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/665,566

(22) Filed: Oct. 28, 2019

(65) Prior Publication Data

US 2020/0066492 A1 Feb. 27, 2020

Related U.S. Application Data

(63) Continuation of application No. 14/852,127, filed on Sep. 11, 2015, now abandoned.

(30) Foreign Application Priority Data

Jan. 23, 2015 (JP) .............................. JP2015-010810

(51) Int. Cl.
H01L 21/67 (2006.01)
H01J 37/32 (2006.01)
H01L 21/3065 (2006.01)

(52) U.S. Cl.
CPC .. *H01J 37/32449* (2013.01); *H01J 37/32724* (2013.01); *H01J 37/32816* (2013.01);
(Continued)

(58) Field of Classification Search
None
See application file for complete search history.

(56) References Cited

U.S. PATENT DOCUMENTS 6,303,895 B1 10/2001 Husain et al.
6,461,980 B1 * 10/2002 Cheung ................. C23C 16/463
438/765

(Continued)

FOREIGN PATENT DOCUMENTS

JP 2009188162 A 8/2009
JP 2009218242 A 9/2009

(Continued)

OTHER PUBLICATIONS

Office Action dated Aug. 22, 2016 for related Korean Patent Application No. 10-2015-0121680.

(Continued)

*Primary Examiner* — Shamim Ahmed
(74) *Attorney, Agent, or Firm* — Miles & Stockbridge, P.C.

(57) ABSTRACT

Provided is a plasma processing apparatus including a processing chamber which is disposed in a vacuum vessel and able to be decompressed, a sample stage on a top surface of which a wafer to be processed is mounted, an opening which is configured to supply a heat-transfer gas to a gap between the wafer and the top surface of the sample stage, a regulator which regulates a flow rate of the heat-transfer gas, and a controller which regulates an operation of the regulator based on a pressure of the gap detected using an amount of the heat-transfer gas leaking from the regulator to the processing chamber through the gap while the wafer is mounted on the sample stage and an amount of the heat-transfer gas supplied from the opening to the processing chamber while the wafer is not mounted on the sample stage.

5 Claims, 6 Drawing Sheets

(52) U.S. Cl.
CPC .... *H01L 21/3065* (2013.01); *H01L 21/67109* (2013.01); *H01L 21/67253* (2013.01)

(56) References Cited

U.S. PATENT DOCUMENTS

| | | | |
|---|---|---|---|
| 8,288,288 B1 * | 10/2012 | Gage | H01L 21/67201 |
| | | | 34/408 |
| 8,828,257 B2 * | 9/2014 | Kitada | H01J 37/32082 |
| | | | 156/345.51 |
| 2001/0017205 A1 | 8/2001 | Ikeda | |
| 2008/0236614 A1 | 10/2008 | Yakushiji et al. | |
| 2009/0194264 A1 | 8/2009 | Sasaki | |
| 2009/0233443 A1 * | 9/2009 | Sasaki | H01L 21/67109 |
| | | | 438/689 |
| 2010/0163403 A1 | 7/2010 | Kitada et al. | |
| 2014/0373867 A1 | 12/2014 | Harada | |
| 2016/0064189 A1 * | 3/2016 | Tandou | H01J 37/32192 |
| | | | 156/345.33 |
| 2016/0141191 A1 | 5/2016 | Blake | |

FOREIGN PATENT DOCUMENTS

| | | |
|---|---|---|
| JP | 2010153678 A | 7/2010 |
| JP | 2010272873 A | 12/2010 |
| KR | 20090122163 A | 11/2009 |
| TW | 201001612 A | 1/2010 |

OTHER PUBLICATIONS

Office Action dated Mar. 25, 2016 for related Taiwanese Patent Application No. 10520351180.

* cited by examiner

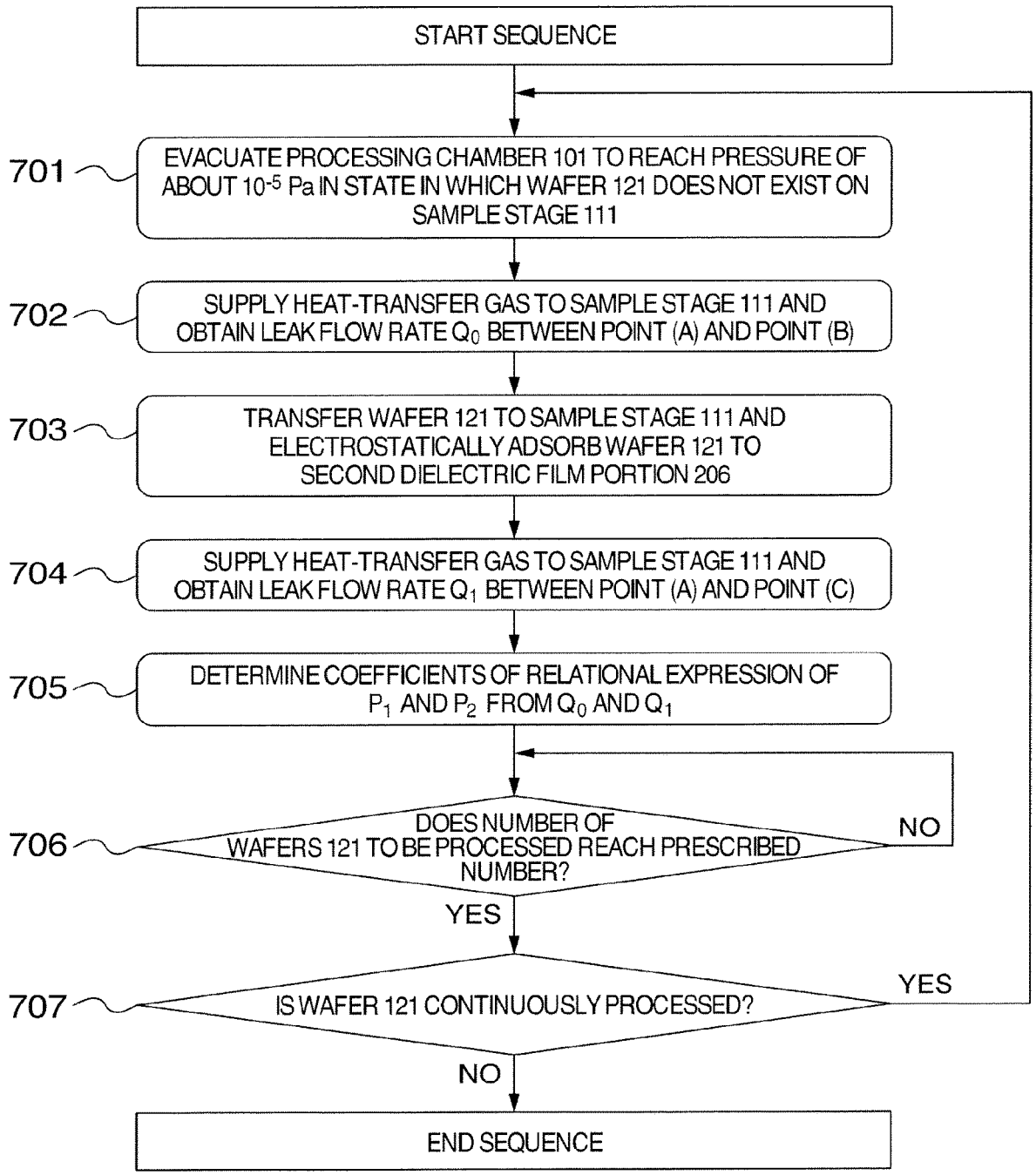

PLASMA PROCESSING APPARATUS

CLAIM OF PRIORITY

The present application is a continuation application of U.S. application Ser. No. 14/852,127, filed Sep. 11, 2015 (now abandoned), which claims priority from Japanese Patent Application JP 2015-010810, filed on Jan. 23, 2015.

BACKGROUND OF THE INVENTION

The present invention relates to a plasma processing apparatus and, more particularly, to a plasma processing apparatus that regulates a temperature of a sample stage, onto which a sample is mounted, to adjust a temperature of the sample to a suitable temperature for processing and processes the sample.

A plasma etching processing apparatus such as a semiconductor wafer processing apparatus supplies a process gas to the inside of a processing vessel (hereinafter, referred to as a vacuum vessel) decompressed down to a vacuum state to generate plasma, mounts a wafer, which is an object to be processed, on a sample stage for mounting a wafer (hereinafter, referred to as a sample stage), and performs processings on a sample on the wafer. The sample stage mainly has a function of adsorbing and holding the wafer by electrostatic force, a function of controlling a temperature of the wafer, and a function of applying a radio-frequency bias voltage to the wafer to assist etching by attracting ions in the plasma.

With regard to the wafer temperature control function by the sample stage, technology for disposing a film-like heater in a film arranged on a top surface of the sample stage and formed of a dielectric material, disposing a coolant groove through which a coolant circulates to remove heat from the heater of the top surface of the sample stage, and implementing a desired temperature distribution of the wafer with the heater to perform etching processing of the sample on the wafer is considered as technology for realizing sufficient speed responsiveness and temperature precision. In the technology using the heater disposed at a position adjacent to the sample, it is advantageous that the temperature of the sample and its distribution can be changed rapidly and a sufficient temperature change can be obtained even when heat input from the plasma is small.

The in-plane temperature of the top surface of the sample stage needs to be almost uniform in precision in a circumferential direction; however, because the sample stage has a structure in which a dielectric film, the heater, and a coolant flow channel are combined, shapes and manufacturing methods of the individual elements need to be devised.

As such technology, one disclosed in JP-A-2009-218242 has been known. In this document of the related technology, it is disclosed that a heater is formed on a sample stage, and a resistance value of the heater is regulated based on results of detection of the distribution of the temperature when power is supplied to the heater, so that a distribution of a temperature becomes a predetermined one.

Also, in JP-A-2010-272873, technology for decreasing the coolant flow rate to suppress increase of the heat transfer coefficient of the coolant by adapting a coolant flow channel cross-section of the coolant groove in the sample stage to be different from other places in a region of a degree of dryness at which a heat transfer coefficient increases, so that the heat transfer coefficient of the coolant becomes uniform in a plane of base material, is disclosed.

SUMMARY OF THE INVENTION

In the above related technologies, the following aspects are not sufficiently considered and problems have arisen.

Namely, heat-transfer gas is often caused to flow in between the dielectric layer of the sample stage and the wafer to complement contact heat transfer between a back surface of the wafer and a wafer adsorption surface of the sample stage and further transmit a temperature of a surface other than the wafer adsorption surface of the sample stage to the wafer. It is considered that the methods disclosed in JP-A-2009-218242 and JP-A-2010-272873 are effective in making the wafer surface temperature uniform with respect to the heater and the coolant flow channel forming the sample stage; however, a heat transfer effect to the wafer by the heat-transfer gas needs to function so that the temperature distribution becomes constant all the time of an operation of the sample stage.

Particularly, in the wafer adsorption surface of the sample stage, a wafer adsorption area may be decreased to minimize change with time caused by plasma exposure or to reduce contamination on the back surface of the wafer and in such the case, because a heat-transfer gas distribution region becomes broad, an influence of the heat transfer effect by the heat-transfer gas becomes notable.

The heat transfer effect of the heat-transfer gas changes depending on parameters such as a physical property, a flow rate, a pressure, and a temperature of the heat-transfer gas and a temperature and a surface property of the heat-transfer gas flow channel. Among those, as for a surface of the heat-transfer gas flow channel of the sample stage, minute errors in dimensions and a surface roughness may be produced for each individual of manufactured sample stages, so that a wafer surface temperature distribution may be different for each individual.

Also, in the surface of the heat-transfer gas flow channel of the sample stage, because change with time of the surface property due to long-term plasma exposure is unavoidable, a problem arises that the wafer surface temperature distribution would change as a plurality of wafers are processed. For this reason, there has been a possibility that desired processing results of the wafers during processing can't be obtained and a yield is lowered. In the above related technologies, these problems are not sufficiently considered.

An object of the present invention is to provide a plasma processing apparatus in which a yield is improved.

From above, a wafer surface temperature distribution can be maintained constant without depending on an individual difference of a surface property of a heat-transfer gas flow channel of each sample stage or change with time of the surface property of the heat-transfer gas flow channel after a plurality of wafers are processed.

A plasma processing method comprises steps of: (i) locating and holding a wafer to be processed on a top surface of a sample stage disposed in a processing chamber an inside of which is decompressed; (ii) supplying a heat-transfer gas into a gap between the wafer and the top surface of the sample stage; and (iii) generating a plasma in a space above the sample stage inside the processing chamber and starting processing of the wafer, wherein the heat-transfer gas which is supplied from a gas source flows through a supply path disposed inside the sample stage into the gap via an opening which is arranged on the top surface of the sample stage, and wherein a supply amount of the heat-transfer gas is adjusted to maintain a pressure of the heat-transfer gas in the gap in an allowable range based upon a pressure value of the heat-transfer gas which is detected at a certain position on the supply path and a value of a pressure drop of the heat-transfer gas between the certain position of the supply path and the gap between the wafer and the top surface of the sample stage via the supply path.

The pressure drop of the heat-transfer gas via the supply path can be determined using a value of a pressure change of the heat-transfer gas in the supply path which is detected in advance when an amount of the heat-transfer gas is supplied through the supply path into the processing chamber via the opening on the top surface of the sample stage while the wafer is not located on the top surface of the sample stage. The value of the pressure change of the heat-transfer gas in the supply path is detected after a prescribed number of wafers is processed.

The pressure drop of the heat-transfer gas via the supply path can be determined using a value of a pressure change of the heat-transfer gas in the supply path which is detected in advance when an amount of the heat-transfer gas is supplied through the supply path into the processing chamber via the opening on the top surface of the sample stage while the processing chamber is decompressed in high vacuum exhaust and the wafer is not located on the top surface of the sample stage. The value of the pressure change of the heat-transfer gas in the supply path is detected after a prescribed number of wafers is processed.

According to the present invention, when a processing chamber is needed to be started up to get ready for processing of a sample on a wafer and/or periodically after processing of samples on wafers have been performed over a plurality of wafers, by measuring a leak flow rate of a heat-transfer gas flow channel and updating coefficients of a pressure control expression, a heat-transfer gas pressure of the back side of the wafer can be controlled constant at any target value and a heat transfer coefficient by the heat-transfer gas can be made constant. From above, a wafer surface temperature distribution can be maintained constant without depending on an individual difference of a surface property of a heat-transfer gas flow channel of each sample stage or change with time of the surface property of the heat-transfer gas flow channel after a plurality of wafers are processed.

Other objects, features, and advantages of the invention will become apparent from the following description of the embodiments of the invention taken in conjunction with the accompanying drawings.

BRIEF DESCRIPTION OF THE DRAWINGS

FIG. 7 is a flowchart illustrating a flow of an operation of a plasma processing apparatus according to a modification of the embodiment of the present invention.

DESCRIPTION OF THE EMBODIMENTS

Hereinafter, embodiments of the present invention are described using the drawings.

An embodiment of the present invention is described using the drawings.

Figure 1:
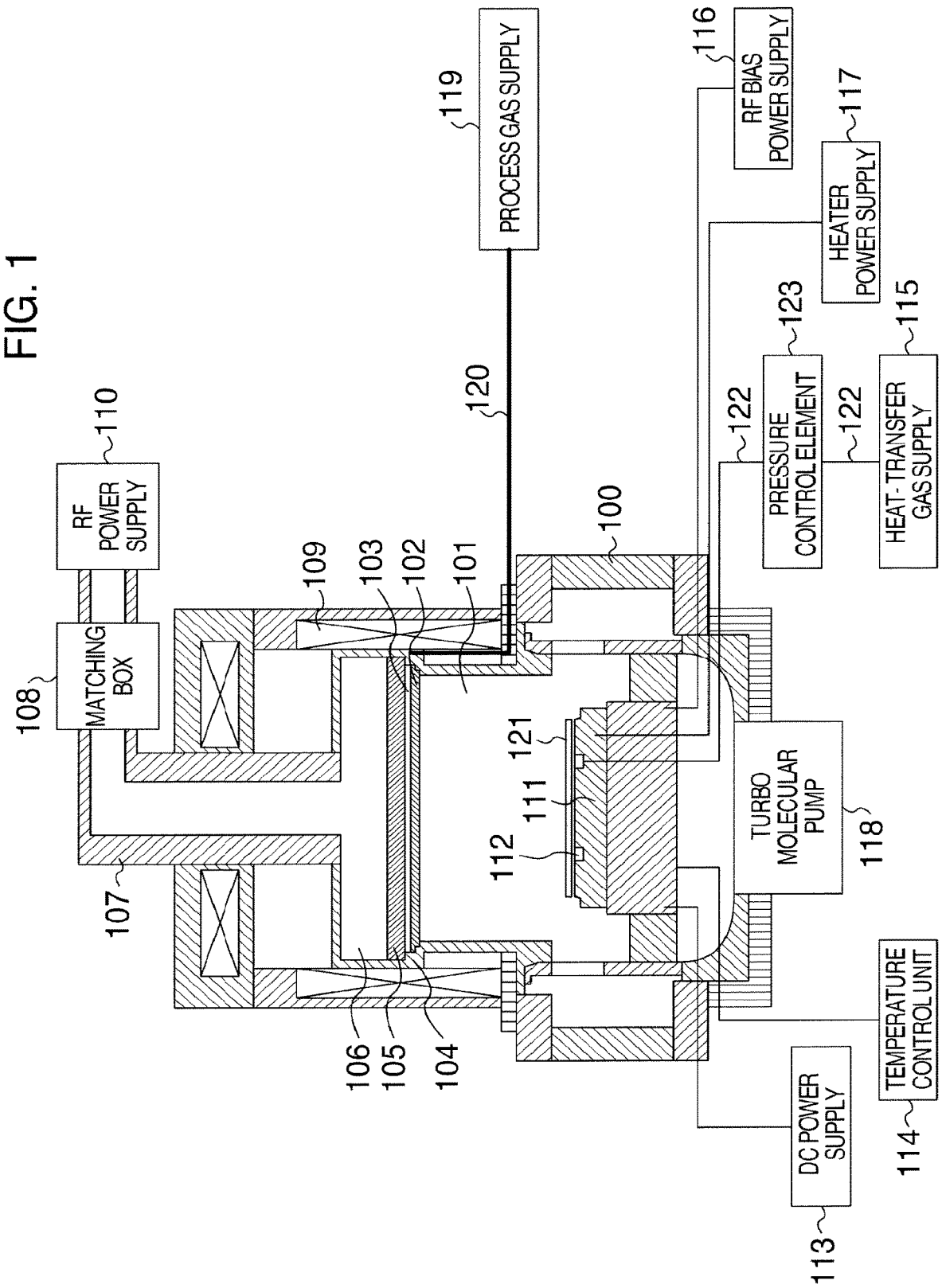
FIG. 1 is a longitudinal cross-section illustrating a schematic configuration of a plasma processing apparatus according to an embodiment of the present invention.

FIG. 1 is a longitudinal cross-section illustrating a schematic configuration of a plasma processing apparatus according to an embodiment of the present invention. The apparatus includes a vacuum vessel 100, an electromagnetic field supplying mechanism that is circumferentially disposed over the vacuum vessel 100 and supplies an electric field and a magnetic field to an inside of the vacuum vessel 100, and an exhaust mechanism that is disposed below the vacuum vessel 100 and evacuates the inside of the vacuum vessel 100.

A processing chamber 101 is disposed in the vacuum vessel 100, an RF power supply 110 which supplies a radio frequency wave to an inside of the processing chamber 101 and a solenoid coil 109 which supplies an electromagnetic wave to the inside of the processing chamber 101 are provided in the upper part of the vacuum vessel 100; in the lower part of the vacuum vessel 100, a sample stage 111 on a top surface of which a substrate-like sample of an object to be processed such as a wafer is mounted and an exhaust device including a turbo molecular pump 118 are provided.

The electromagnetic field supplying mechanism includes the solenoid coil 109 that is disposed in the upper part the vacuum vessel 100 and the RF power supply 110 that is disposed over the vacuum vessel 100 and supplies an electromagnetic wave. The electromagnetic wave supplied from the RF power supply 110 propagates through a waveguide 107 via an isolator not illustrated in the drawings and a matching box 108 and, after passing through a resonance space 106, is introduced into the processing chamber 101 through a quartz plate 105 and a shower plate 102.

The processing chamber 101 has an approximately cylindrical shape and is a space where plasma is formed when plasma processing is executed on a sample of a processing object.

A ceiling member of a cylindrical shape hermetically sealing the processing chamber 101 is provided above the processing chamber 101; the ceiling member includes the quartz plate 105 formed of a dielectric such as a quartz and the shower plate 102, and a fine gap 103 is formed between the quartz plate 105 and the shower plate 102. The fine gap 103 is a space of a cylindrical shape and the shower plate 102 is disposed below the space. In the shower plate 102, many small holes are provided as being arranged in a shape of a plurality of concentric circles. A gas ring 104 is disposed on the outer circumferential side of the shower plate 102 and the quartz plate 105. A gas passage to supply a process gas to the fine gap 103 is provided in the gas ring 104; the process gas is supplied from a process gas supply 119 to the fine gap 103 through a process gas supply piping 120 and the gas passage of the gas ring 104 and, thereafter, is dispersed equally to be supplied in the processing chamber 101 through the multiple small holes provided in the shower plate 102.

The sample stage 111 disposed below the processing chamber 101 has a cylindrical shape and a top surface of the sample stage 111 is covered with a dielectric film. In the sample stage 111, a flow channel not illustrated in the drawings is disposed in a concentric circle shape or a spiral shape, and a coolant a temperature and/or a flow rate (flow speed) of which are regulated by a temperature control unit 114 is introduced into the flow channel. In addition, a heater not illustrated in the drawings is disposed inside the dielectric film and the heater is supplied with power by a heater power supply 117 to be heated.

A heat-transfer gas flow channel 112 is provided between the dielectric film of the top surface of the sample stage 111 and a back surface of a wafer 121 and a gas having good heat transfer capability such as He is supplied from a heat-transfer gas supply 115 via a heat-transfer gas supply piping 122. A pressure value of the heat-transfer gas is monitored at a disposition location of a pressure control element 123.

In addition, on the top surface of the sample stage 111, a dielectric film including a film-like electrode for electrostatic chuck to adsorb the wafer 121 onto the sample stage 111 using electrostatic force is disposed and the electrode for the electrostatic chuck is electrically connected to a DC power supply 113 to apply a DC voltage thereto. Moreover, a metal electrode of a disk shape to which RF power is supplied in order to form a bias potential above a surface of the wafer 121 on the sample stage 111 during processing is disposed in the sample stage 111 and the electrode is electrically connected to an RF bias power supply 116 which supplies the RF power.

With such the plasma etching processing apparatus, the wafer 121 on which a prescribed processing is executed is mounted on a robot arm in a vacuum transfer chamber that is a different vacuum vessel (not illustrated in the drawing) coupled to a sidewall of the vacuum vessel 100 and includes a transfer mechanism such as the robot arm disposed in a decompressed internal space, transferred to the processing chamber 101, delivered to the sample stage 111 to be mounted on a mounting surface of the top surface thereof, adsorbed and held thereafter on the dielectric film by the electrostatic force formed by the DC voltage supplied from the DC power supply 113.

Next, the process gas is introduced from the process gas supply 119 to the fine gap 103 via the process gas supply piping 120 and is supplied into the processing chamber 101 through the multiple small holes formed in the shower plate 102. The process gas is turned into plasma by an interaction of an electromagnetic wave passing through the resonance space 106 and introduced into the processing chamber 101 via the quartz plate 105 and the shower plate 102 and a magnetic field by the solenoid coil 109 and the plasma is formed over the wafer 121. Furthermore, the RF power is applied to the sample stage 111 by the RF bias power supply 116, ions in the plasma are attracted onto the wafer 121 by a potential difference between the bias potential by the RF bias formed over the top surface of the wafer 121 and the plasma potential, and processing starts while an etching reaction is assisted.

After completion of an etching processing, the plasma and the RF bias are stopped, supply of the DC voltage from the DC power supply 113 is stopped, and the electrostatic force becomes weak and is removed.

Next, a detailed structure of the sample stage 111 is described with reference to FIG. 2.

Figure 2:
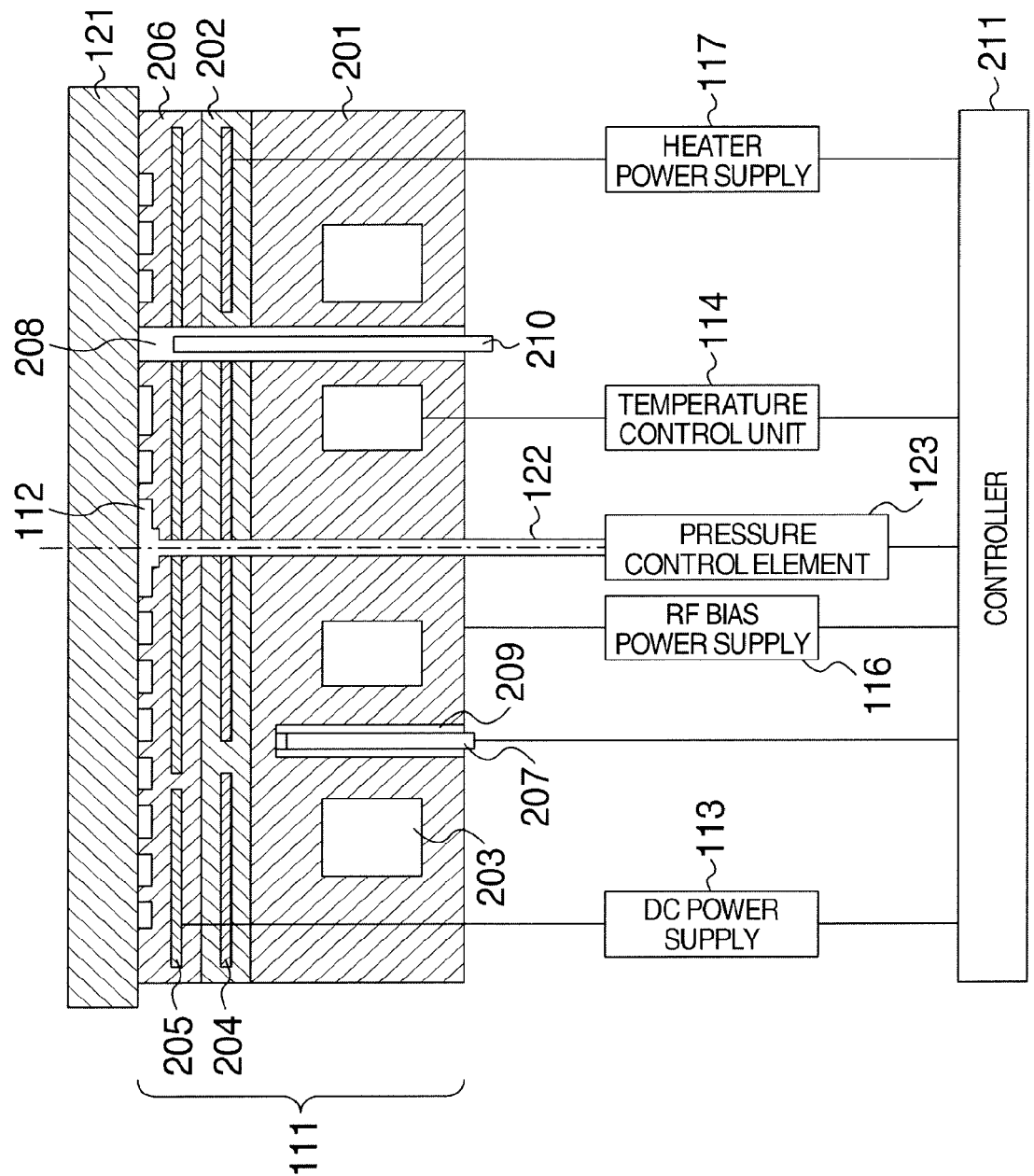
FIG. 2 is a longitudinal cross-section illustrating an enlarged schematic configuration of a sample stage of the plasma processing apparatus according to the embodiment illustrated in FIG. 1.

FIG. 2 is a longitudinal cross-section illustrating an enlarged schematic configuration of the sample stage of the plasma processing apparatus according to the embodiment illustrated in FIG. 1. The sample stage 111 has a cylindrical shape or a disk shape, and includes a base portion 201 that is formed of a metal such as Ti, aluminum containing ceramic, molybdenum, and tungsten, a first dielectric film portion 202 that is disposed as being bonded to a top surface of the base portion 201 and is formed with a dielectric such as $Al_2O_3$ including therein a heater 204, and a second dielectric film portion 206 that is disposed on the first dielectric film 202 and is formed with a dielectric such as $Al_2O_3$ including therein an electrode 205 for electrostatic chuck formed of a metal such as tungsten. A through hole 208 which a pin 210 for wafer lift penetrates is provided in the sample stage 111.

The pin 210 is provided toward the lower part of the sample stage 111, moves up and down relative to the sample stage 111 through the through hole 208, and delivers a wafer. The heater 204 is electrically connected to the heater power supply 117 through a feeder structure not illustrated in the drawings. The electrode 205 for the electrostatic chuck is electrically connected to the DC power supply 113 for the electrostatic chuck through the feeder structure not illustrated in the drawings.

Inside the base portion 201, coolant grooves 203, which are coolant passages through which a coolant circulates, and a temperature sensor 207 which measures a temperature of a top surface of the base are disposed.

As for the coolant grooves 203, an inlet part into which the coolant is introduced and an outlet part from which it is discharged are connected to the temperature control unit 114 outside the vacuum vessel 100 by a pipeline. The temperature control unit 114 regulates a flow rate (flow speed) and/or a temperature of the coolant passing through the coolant grooves 203 and circulating according to a command signal from a controller 211. The coolant flows through the coolant grooves 203 and cools the base portion 201. The base portion 201 is cooled, so that the wafer 121 held on the sample stage 111 is cooled.

For the temperature sensor 207, a thermocouple, a platinum resistance thermometer, or the like is used. The temperature sensor 207 is disposed inside a hole 209. The temperature sensor 207 is electrically connected to the controller 211.

The heat-transfer gas supply piping 122 is coupled to the heat-transfer gas supply 115 and introduces the heat-transfer gas above the sample stage 111. Below the heat-transfer gas supply piping 122, the pressure control element 123 is disposed. The pressure control element 123 is electrically connected to the controller 211.

The wafer 121 is mounted on a top surface of the second dielectric film portion 206 by an operation of a transfer mechanism not illustrated in the drawings, the pin 210, or the like. Then, power is supplied from the DC power supply 113 for the electrostatic chuck to the electrode 205 for the electrostatic chuck and the electrostatic force is formed. Thereby, the wafer is adsorbed and held on the second dielectric film portion 206.

After the wafer 121 is adsorbed and held on the second dielectric film portion 206, the bias potential is applied to the wafer 121. When the wafer 121 is processed using the plasma, heat input to the wafer 121 is accompanied. A rise of the temperature of the wafer 121 according to this heat input greatly affects an etching profile. For this reason, it is necessary to cool the wafer 121.

However, because the processing chamber 101 is decompressed, heat transfer is insufficient only by mounting the wafer on the sample stage 111. Therefore, the heat-transfer gas is introduced between the second dielectric film portion 206 and the wafer 121 mounted on protrusions formed on the surface of the second dielectric film portion 206 from the heat-transfer gas supply 115 through the heat-transfer gas supply piping 122. Thereby, a heat transfer rate necessary between the wafer and the second dielectric film portion 206 is secured and a temperature increase of the wafer is suppressed.

Incidentally, in this embodiment, the heat-transfer gas is regulated by the controller 211, such that its pressure value is detected by the pressure control element 123, a command calculated at the controller 211, which receives an output thereof, according to the pressure value is sent, and a valve aperture is regulated to render a pressure become a value within a target allowable range. In addition, the controller 211 sends a command signal to a flow rate control element disposed in a heat-transfer gas supply not illustrated in the drawings and, as a result, an operation thereof is regulated such that a flow rate of the heat-transfer gas supplied becomes one in a prescribed allowable range.

In this embodiment, a method of controlling a pressure of the heat-transfer gas is to regulate using a flow rate control element not illustrated in the drawings, such that the pressure value is made to be in the prescribed allowable range in the pressure control element 123, or to calculate a pressure of a back surface of the wafer 121 with a pressure relation expression predetermined such that a value of the pressure of the back surface of the wafer 121 is made to be in the prescribed allowable range and to control the pressure by the pressure control element 123, or to regulate by a combination thereof. First, in this embodiment, a configuration to regulate the pressure of the heat-transfer gas between the wafer 121 and the second dielectric film portion 206 is described.

The temperature of the top surface of the base portion is detected by the temperature sensor 207. The temperature detected by the temperature sensor 207 is received by the controller 211. The controller 211 can estimate based on the detected temperature of the base portion 201 the temperature of the top surface of the second dielectric film portion 206, which is a mounting surface, or a temperature of the wafer 121 mounted thereon or its distribution using an operation device in the controller 211 or using a program stored in the controller 211 or an external storage medium such as a hard disk connected such that communication is enabled.

The controller 211 operates and detects a power value to be output by the heater power supply 117 according to a detection result of the temperature of the second dielectric film portion 206 or the wafer 121 using a program stored previously in a storage device. By sending a command to the heater power supply 117 to output the power value, a calorific value of the heater 204 can be controlled. As such, the detected temperature of the sample stage 111 is fed back to the controller 211, which is a control unit. Thereby, the calorific value of the heater 204 is regulated and the temperature of the wafer or its distribution optimal for processing is realized.

Figure 3:
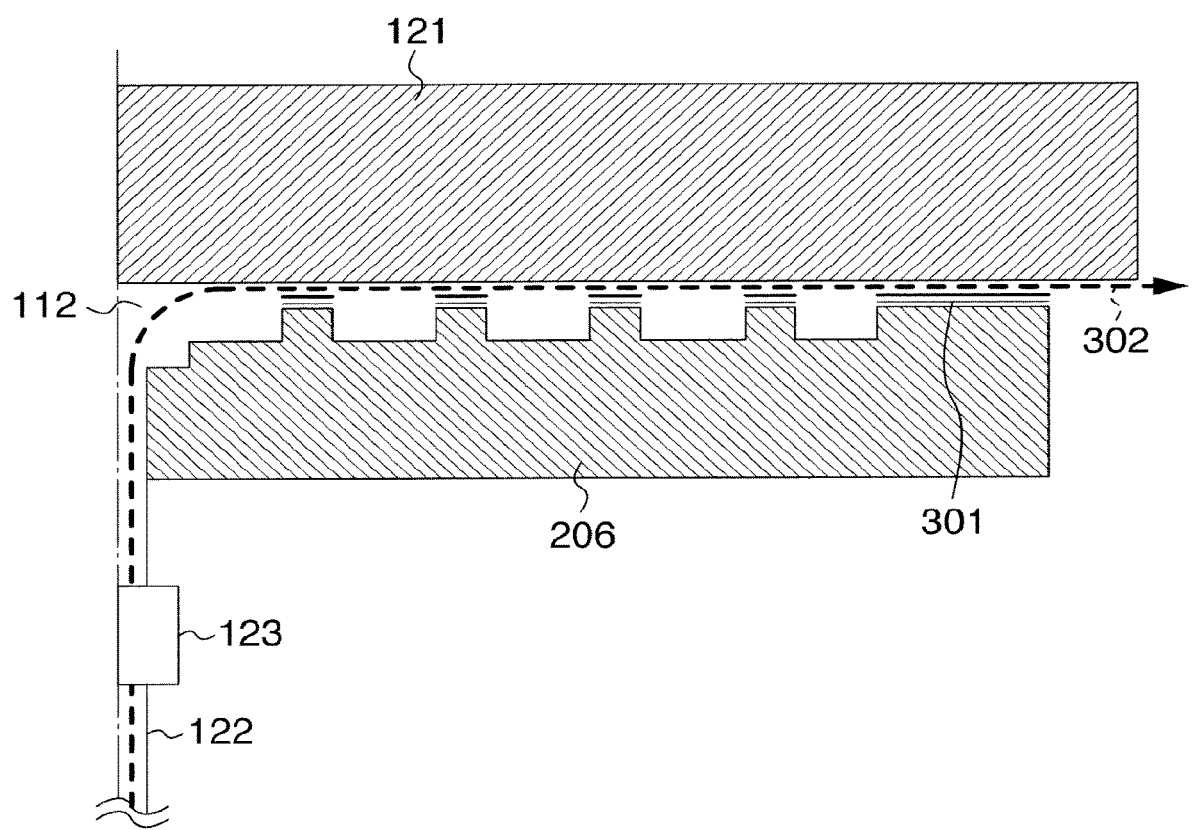
FIG. 3 is a longitudinal cross-section illustrating an enlarged schematic configuration of the vicinity of a dielectric film of the sample stage of the plasma processing apparatus according to the embodiment illustrated in FIG. 2.

FIG. 3 is a longitudinal cross-section illustrating an enlarged schematic configuration of the vicinity of the dielectric film of the sample stage of the plasma processing apparatus according to the embodiment illustrated in FIG. 2. In particular, it shows an enlarged view of a radial portion of the sample stage 111 illustrated in FIG. 2 in the vicinity of the wafer 121 and the second dielectric film portion 206.

On the surface of the second dielectric film portion 206, an adsorption surface 301 to mount the wafer 121 and the heat-transfer gas flow channel 112 to circulate the heat-transfer gas are provided. A flattening processing is normally executed on the adsorption surface 301; however, because unevenness having a surface roughness Ra of about 0.1 μm is generated, circulation of the heat-transfer gas occurs in the adsorption surface 301. As a result, as illustrated in FIG. 3, a flow 302 of the heat-transfer gas in a radial direction of the sample stage is generated and the heat-transfer gas flows out from an outer circumferential edge of the second dielectric film portion 206 to the processing chamber 101 side and is exhausted by the turbo molecular pump 118.

Figure 4:
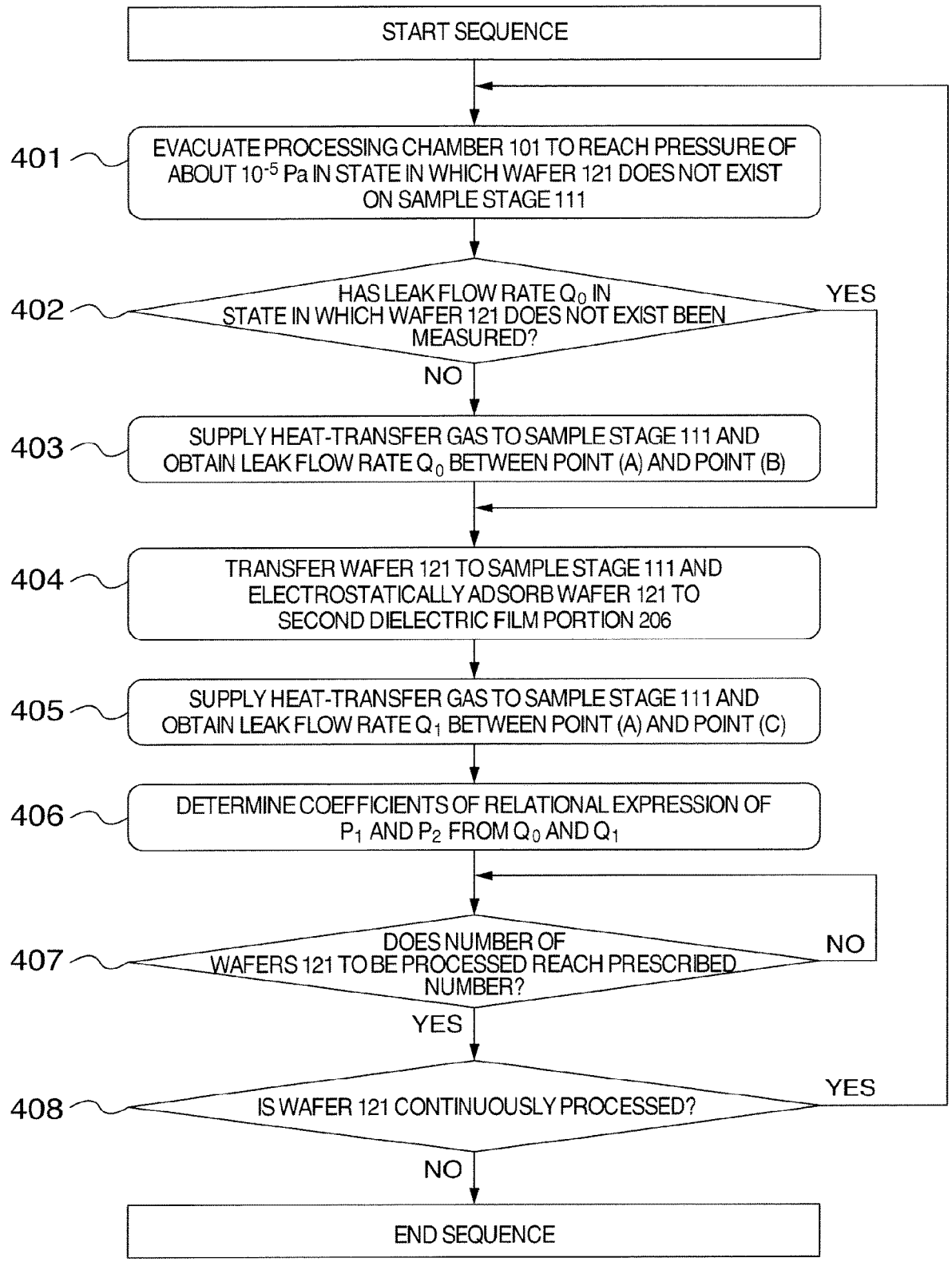
FIG. 4 is a flowchart illustrating a flow of an operation of the plasma processing apparatus according to the embodiment illustrated in FIG. 1.
Figure 5:
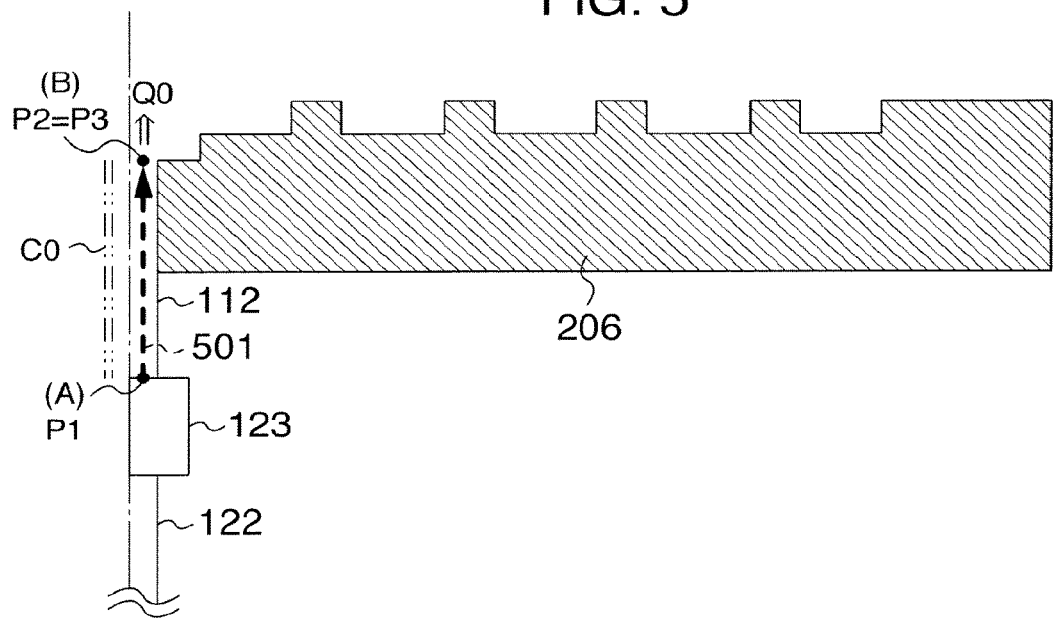
FIG. 5 is a longitudinal cross-section illustrating an enlarged schematic configuration of the vicinity of the dielectric film in a state in which a wafer is not mounted on the sample stage of the plasma processing apparatus according to the embodiment illustrated in FIG. 2.
Figure 6:
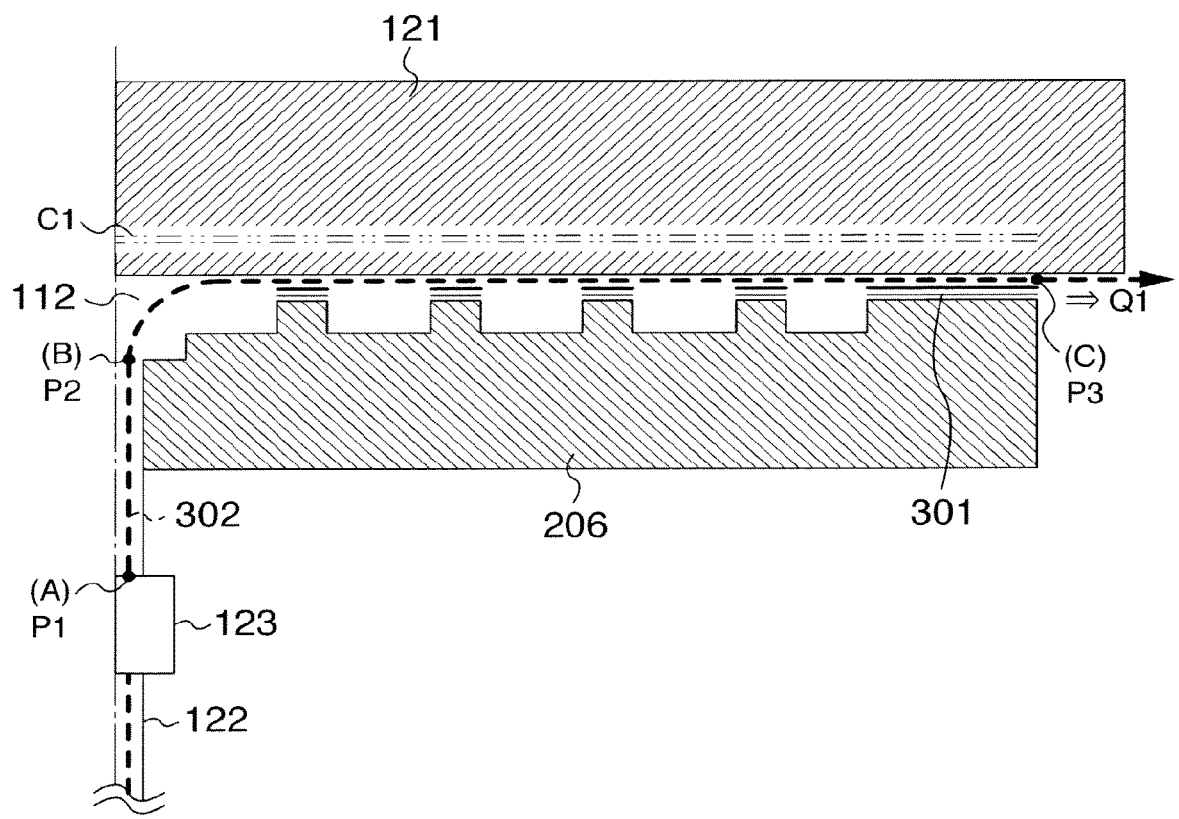
FIG. 6 is a longitudinal cross-section illustrating an enlarged schematic configuration of the vicinity of the dielectric film in a state in which a wafer is mounted on the sample stage of the plasma processing apparatus according to the embodiment illustrated in FIG. 2.

FIG. 4 illustrates a sequence flowchart according to the embodiment of the present invention and a sequence is described in detail below. FIGS. 5 and 6 are explanatory diagrams in the flowchart of FIG. 4.

FIG. 4 is a flowchart illustrating a flow of an operation of the plasma processing apparatus according to the embodiment illustrated in FIG. 1. FIG. 5 is a longitudinal cross-section illustrating an enlarged schematic configuration of the vicinity of the dielectric film in a state in which the wafer is not mounted on the sample stage of the plasma processing apparatus according to the embodiment illustrated in FIG. 2. FIG. 6 is a longitudinal cross-section illustrating an enlarged schematic configuration of the vicinity of the dielectric film in a state in which a wafer is mounted on the sample stage of the plasma processing apparatus according to the embodiment illustrated in FIG. 2

First, a sequence according to the embodiment of the present invention in the case in which it is started up to get ready for processing a wafer 121 after performing maintenance on the inside of the processing chamber 101 is described. As illustrated in FIG. 4, first, at Block 401, while a processing of a wafer 121 has not started and a wafer 121 is not mounted on the sample stage 111, the inside of the processing chamber 101 is evacuated until the inner portion of the processing chamber 101 has a pressure value of the order of $10^{-5}$ Pa (a value of a pressure equivalent to or lower than a pressure during the processing). In this state, at least part of particles such as products formed in the processing chamber 101 during formerly performed processing of any wafers 121 and adhered to an inner surface and a process gas, which exist inside the processing chamber 101, are discharged to the outside of the processing chamber 101 and the degree of cleanness of the processing chamber 101 is improved.

Next, whereas a wafer 121 is not mounted on the sample stage 111, at Block 403, the heat-transfer gas is supplied from the heat-transfer gas supply 115 into the heat-transfer gas flow channel 112 of the sample stage 111. The above state is illustrated in FIG. 5.

In FIG. 5, let a pressure detection point of the pressure control element 123 be Point (A) and a place on an external surface of the second dielectric film portion 206 on the mounting side of a wafer 121 after passing through the heat-transfer gas flow channel 112 be Point (B). The heat-transfer gas passing through Point (B) is discharged into the processing chamber 101 and is exhausted by the turbo molecular pump 118. In the above state, after the heat-transfer gas is supplied at a constant pressure monitored by the pressure control element 123, the supply is stopped and a variation amount ΔP of the pressure value of Point (A) until an arbitrary time and an elapsed time Δt are measured. In addition, a volume $V_0$ of the heat-transfer gas flow channel 112 from Point (A) to Point (B) is obtained in advance and a leak flow rate $Q_0$ of the heat-transfer gas discharged from Point (B) is calculated by the following expression (1) from the time variation of the measured pressure value of Point (A) and the volume $V_0$ from Point (A) to Point (B).

$$Q_0 = \frac{\Delta P \cdot V_0}{\Delta t}. \qquad (1)$$

From the calculated leak flow rate $Q_0$ above, any pressure value $P_1$ of Point (A), and a pressure value $P_3$ of the processing chamber 101 in the above state, assuming $P_3=P_2$ since $P_3$ is almost equal to a pressure $P_2$ of Point (B), a conductance $C_0$ between Point (A) and Point (B) is calculated by the following expression (2).

$$C_0 = \frac{Q_0}{P_1 - P_2}. \qquad (2)$$

In addition, once the expression (2) is arranged for $P_2$, the following expression (3) is obtained.

$$P_2 = P_1 - \frac{Q_0}{C_0}. \qquad (3)$$

If it is considered that the conductance $C_0$ from Point (A) to Point (B) is rarely affected by change with time due to plasma exposure, $P_2$ becomes smaller than $P_1$ by a fixed value $Q_0/C_0$ once $Q_0$ and $C_0$ are measured.

Next, at Block 404, a wafer 121 is transferred to the inside of the processing chamber 101 and mounted on the sample stage 111. Then, by applying a DC voltage to the electrode 205 for the electrostatic chuck, the wafer 121 is electrostatically adsorbed onto the second dielectric film portion 206. Here, a front surface property of the wafer 121 electrostatically adsorbed onto the second dielectric film portion 206 may not be the same as that of a product wafer; however, the back surface properties need to be equivalent to each other.

In the above state, at Block 405, the heat-transfer gas is supplied from the heat-transfer gas supply 115 to the heat-transfer gas flow channel 112 of the sample stage 11. The above state is illustrated in FIG. 6.

In FIG. 6, let the pressure detection point of the pressure control element 123 be Point (A), the place on the external surface of the second dielectric film portion 206 on the mounting side of the wafer 121 after passing through the heat-transfer gas flow channel 112 be Point (B), and a place where the heat-transfer gas flows in a direction illustrated in 302 and reaches an outer circumferential edge of the second dielectric film portion 206 be Point (C). The heat-transfer gas passing through Point (C) is discharged into the processing chamber 101 and is exhausted by the turbo molecular pump 118.

In the above state, after the heat-transfer gas is supplied at the constant pressure monitored by the pressure control element 123, the supply is stopped and a variation amount $\Delta P$ of the pressure value of Point (A) until an arbitrary time and an elapsed time $\Delta t$ are measured. In addition, a volume $V_1$ of the heat-transfer gas flow channel 112 from Point (A) to Point (C) is obtained in advance and a leak flow rate $Q_1$ of the heat-transfer gas discharged from Point (C) is calculated by the following expression (4) from the time variation of the measured pressure value of Point (A) and the volume $V_1$ from Point (A) to Point (C).

$$Q_1 = \frac{\Delta P \cdot V_1}{\Delta t}. \qquad (4)$$

From the calculated leak flow rate $Q_1$ above, any pressure value $P_1$ of Point (A), any pressure value $P_2$ of Point (B), and the pressure value $P_3$ of the processing chamber 101 in the above state, a conductance $C_1$ between Point (B) and Point (C) is calculated by the following expression (5).

$$C_1 = \frac{Q_1}{P_2 - P_3}. \qquad (5)$$

Next, a process at Block 406 is described below. From the obtained conductance $C_0$ and $C_1$, a total conductance $C$ from Point (A) to Point (C) is as represented by the following expression (6).

$$C = \frac{C_0 C_1}{C_0 + C_1} = \frac{Q_0 Q_1}{(P_2 - P_3)Q_0 + (P_1 - P_2)Q_1}. \qquad (6)$$

Here, letting a flow rate from Point (A) to Point (C) be Q, a relation of the following expression (7) holds.

$$Q = C(P_1 - P_3) \qquad (7).$$

When the expression (6) is substituted into the expression (7) and a expression is arranged for $P_2$, the following expression (8) is obtained.

$$P_2 = \frac{(Q_0 - Q)Q_1}{(Q_0 - Q_1)Q} P_1 + \frac{(Q - Q_1)Q_0}{(Q_0 - Q_1)Q} P_3. \qquad (8)$$

In the expression (8), because $Q_0$ and $Q_1$ are known, it yields a relational expression of the variables $P_2$, $P_1$, $P_3$, and Q. Here, if $P_3$ is assumed to be a fixed value at a pressure value at the time of high vacuum exhaust at Block 401 and Q is also assumed to be any fixed value, it becomes a relational expression of the variables $P_1$ and $P_2$ and $P_2$ can be controlled by monitoring and adjusting $P_1$.

Next, a sequence according to the embodiment of the present invention in a state in which the surface property of the second dielectric film portion 206 of the sample stage 111 is exposed to the plasma and is changed after a plurality of wafers 121 are processed in the processing chamber 101 is described.

At Block 407, when the number of processed wafers 121 reaches a prescribed number, the leak flow rate $Q_1$ in FIG. 6 is measured again. The prescribed number is the number in which the change with time of the surface property of the second dielectric film portion 206 does not affect an unallowable change of the temperature distribution of the wafer 121 or the number when the change with time of the surface property of the second dielectric film portion 206 starts to affect the unallowable change of the temperature distribution of the wafer 121; the specific number to be processed is different depending on outcomes of the surface of the second dielectric film portion 206 and the back surface of the wafer 121, a plasma density, gas species, and gas flow rates of the processing chamber 101, and the like.

At Block 408, when the processing of wafers 121 is continued in the processing chamber 101, in order to measure the leak flow rate $Q_1$ again after processing of the wafers of the defined number described at Block 407, the sequence from Block 401 to Block 406 is executed. However, as seen in Block 402, because the leak flow rate $Q_0$ in a state in which a wafer 121 does not exist is already measured, the measurement is omitted.

From above, even when the surface property of the second dielectric film portion 206 changes with time, by re-measuring the leak flow rate $Q_1$ and updating coefficient values of the above expression (8), consistency between the expression (8) and the surface property of the second dielectric film portion 206 is secured and $P_2$ can be controlled.

In the embodiment described above, the leak flow rate $Q_0$ is measured only once when the apparatus is started up such that it becomes ready to process a wafer 121 after the inside of the processing chamber 101 is maintained; however, let's consider the case in which the surface property of the inner wall of the heat-transfer gas flow channel 112 changes due to exposure to the plasma for a reason such as a diameter of the heat-transfer gas flow channel 112 being large. In the above case, it is necessary to re-measure $Q_0$ when the leak flow rate $Q_1$ is measured again and a modification of the embodiment is described below.

FIG. 7 shows a sequence flowchart according to a modification of the embodiment. FIG. 7 is a flowchart illustrating a flow of an operation of a plasma processing apparatus according to the modification of the embodiment of the present invention.

In the figure, first, a sequence according to the modification of the embodiment of the present invention is described in the case in which the apparatus is started up to get ready for processing a wafer 121 after the inside of the processing chamber 101 is maintained.

First, at Block 701, while a wafer 121 is not mounted on the sample stage 111, evacuation is performed until a pressure in the processing chamber 101 becomes to the order of $10^{-5}$ Pa. Next, while a wafer 121 is not mounted on the sample stage 111, at Block 702, the heat-transfer gas is supplied from the heat-transfer gas supply 115 to the heat-transfer gas flow channel 112 of the sample stage 111.

In FIG. 5, let a pressure detection point of the pressure control element 123 be Point (A) and a place on an external surface of the second dielectric film portion 206 on the mounting side of a wafer 121 after passing through the heat-transfer gas flow channel 112 be Point (B). The heat-transfer gas passing through Point (B) is discharged into the processing chamber 101 and is exhausted by the turbo molecular pump 118. In the above state, after the heat-transfer gas is supplied at a constant pressure monitored by the pressure control element 123, the supply is stopped and a variation amount $\Delta P$ of the pressure value of Point (A) until an arbitrary time and an elapsed time $\Delta t$ are measured. In addition, a volume $V_0$ of the heat-transfer gas flow channel 112 from Point (A) to Point (B) is obtained in advance and a leak flow rate $Q_0$ of the heat-transfer gas discharged from Point (B) is calculated by the following expression (9) from the time variation of the measured pressure value of Point (A) and the volume $V_0$ from Point (A) to Point (B).

$$Q_0 = \frac{\Delta P \cdot V_0}{\Delta t}. \tag{9}$$

From the calculated leak flow rate $Q_0$ above, any pressure value $P_1$ of Point (A), and a pressure value $P_3$ of the processing chamber 101 in the above state, assuming $P_3=P_2$ since $P_3$ is almost equal to a pressure $P_2$ of Point (B), a conductance $C_0$ between Point (A) and Point (B) is calculated by the following expression (10).

$$C_0 = \frac{Q_0}{P_1 - P_2}. \tag{10}$$

In addition, once the expression (10) is arranged for $P_2$, the following expression (11) is obtained.

$$P_2 = P_1 - \frac{Q_0}{C_0}. \tag{11}$$

Next, at Block 703, a wafer 121 is transferred to the inside of the processing chamber 101 and mounted on the sample stage 111. Then, by applying a DC voltage to the electrode 205 for the electrostatic chuck, the wafer 121 is electrostatically adsorbed onto the second dielectric film portion 206. Here, a front surface property of the wafer 121 electrostatically adsorbed onto the second dielectric film portion 206 may not be the same as that of a product wafer; however, the back surface properties need to be equivalent to each other.

In the above state, at Block 704, the heat-transfer gas is supplied from the heat-transfer gas supply 115 to the heat-transfer gas flow channel 112 of the sample stage 11. In FIG. 6, let the pressure detection point of the pressure control element 123 be Point (A), the place on the external surface of the second dielectric film portion 206 on the mounting side of the wafer 121 after passing through the heat-transfer gas flow channel 112 be Point (B), and a place where the heat-transfer gas flows in a direction illustrated in 302 and reaches an outer circumferential edge of the second dielectric film portion 206 be Point (C). The heat-transfer gas passing through Point (C) is discharged into the processing chamber 101 and is exhausted by the turbo molecular pump 118. In the above state, after the heat-transfer gas is supplied at the constant pressure monitored by the pressure control element 123, the supply is stopped and a variation amount $\Delta P$ of the pressure value of Point (A) until an arbitrary time and an elapsed time $\Delta t$ are measured. In addition, a volume $V_1$ of the heat-transfer gas flow channel 112 from Point (A) to Point (C) is obtained in advance and a leak flow rate $Q_1$ of the heat-transfer gas discharged from Point (C) is calculated by the following expression (12) from the time variation of the measured pressure value of Point (A) and the volume $V_1$ from Point (A) to Point (C).

$$Q_1 = \frac{\Delta P \cdot V_1}{\Delta t}. \tag{12}$$

From the calculated leak flow rate $Q_1$ above, any pressure value $P_1$ of Point (A), any pressure value $P_2$ of Point (B), and the pressure value $P_3$ of the processing chamber 101 in the above state, a conductance $C_1$ between Point (B) and Point (C) is calculated by the following expression (13).

$$C_1 = \frac{Q_1}{P_2 - P_3}. \tag{13}$$

Next, a process at Block 705 is described below. From the obtained conductance $C_0$ and $C_1$, a total conductance C from Point (A) to Point (C) is as represented by the following expression (14).

$$C = \frac{C_0 C_1}{C_0 + C_1} = \frac{Q_0 Q_1}{(P_2 - P_3)Q_0 + (P_1 - P_2)Q_1}. \quad (14)$$

Here, letting a flow rate from Point (A) to Point (C) be Q, a relation of the following expression (15) holds.

$$Q = C(P_1 - P_3) \quad (15).$$

When the expression (14) is substituted into the expression (15) and a expression is arranged for $P_2$, the following expression (16) is obtained.

$$P_2 = \frac{(Q_0 - Q)Q_1}{(Q_0 - Q_1)Q} P_1 + \frac{(Q - Q_1)Q_0}{(Q_0 - Q_1)Q} P_3. \quad (16)$$

In the expression (16), because $Q_0$ and $Q_1$ are known, it yields a relational expression of the variables $P_2$, $P_1$, $P_3$, and Q. Here, if $P_3$ is assumed to be a fixed value at a pressure value at the time of high vacuum exhaust at Block 701 and Q is also assumed to be any fixed value, it becomes a relational expression of the variables $P_1$ and $P_2$ and $P_2$ can be controlled by monitoring and adjusting $P_1$.

Next, a sequence according to the modification of the embodiment of the present invention in a state in which the surface property of the second dielectric film portion 206 of the sample stage 111 is exposed to the plasma and is changed after a plurality of wafers 121 are processed in the processing chamber 101 is described.

At Block 706, when the number of processed wafers 121 reaches a prescribed number, the leak flow rate $Q_0$ in FIG. 5 and the leak flow rate $Q_1$ in FIG. 6 are measured again. The prescribed number is the number in which the change with time of the surface properties of the heat-transfer gas flow channel 112 and/or the second dielectric film portion 206 do not affect an unallowable change of the temperature distribution of the wafer 121 or the number when the change with time of the surface properties of the heat-transfer gas flow channel 112 and/or the second dielectric film portion 206 start to affect the unallowable change of the temperature distribution of the wafer 121; the specific number to be processed is different depending on outcomes of the surface of the second dielectric film portion 206 and the back surface of the wafer 121, a plasma density, gas species, and gas flow rates of the processing chamber 101, and the like.

At Block 707, when the processing of wafers 121 is continued in the processing chamber 101, in order to measure the leak flow rates $Q_0$ and $Q_1$ again after processing of the wafers of the defined number described at Block 706, the sequence from Block 701 to Block 705 is executed.

From above, even when the surface property of the second dielectric film portion 206 changes with time, by re-measuring the leak flow rates $Q_0$ and $Q_1$ and updating coefficient values of the above expression (16), consistency between the expression (16) and the surface properties of the heat-transfer gas flow channel 112 and the second dielectric film portion 206 is secured and $P_2$ can be controlled.

The present invention is not limited to the plasma etching processing apparatus described above and can be applied to general plasma processing apparatuses including a plasma CVD apparatus suitable for ion implantation or sputtering processing.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method comprising steps of:
locating and holding a wafer to be processed on a top surface of a sample stage disposed in a processing chamber an inside of which is decompressed;
supplying a heat-transfer gas into a gap between the wafer and the top surface of the sample stage; and
generating a plasma in a space above the sample stage inside the processing chamber and starting processing of the wafer,
wherein the heat-transfer gas which is supplied from a gas source flows through a supply path disposed inside the sample stage into the gap via an opening which is arranged on the top surface of the sample stage, and
wherein a supply amount of the heat-transfer gas is adjusted to maintain a pressure of the heat-transfer gas in the gap in an allowable range based upon a pressure value of the heat-transfer gas which is detected at a certain position on the supply path and a value of a pressure drop of the heat-transfer gas between the certain position of the supply path and the gap between the wafer and the top surface of the sample stage via the supply path.

2. The plasma processing method according to claim 1, wherein the pressure drop of the heat-transfer gas via the supply path is determined using a value of a pressure change of the heat-transfer gas in the supply path which is detected in advance when an amount of the heat-transfer gas is supplied through the supply path into the processing chamber via the opening on the top surface of the sample stage while the wafer is not located on the top surface of the sample stage.

3. The plasma processing method according claim 1, wherein the pressure drop of the heat-transfer gas via the supply path is determined using a value of a pressure change of the heat-transfer gas in the supply path which is detected in advance when an amount of the heat-transfer gas is supplied through the supply path into the processing chamber via the opening on the top surface of the sample stage while the processing chamber is decompressed in high vacuum exhaust and the wafer is not located on the top surface of the sample stage.

4. The plasma processing method according to claim 2, wherein the value of the pressure change of the heat-transfer gas in the supply path is detected after a prescribed number of wafers is processed.

5. The plasma processing method according to claim 3, the value of the pressure change of the heat-transfer gas in the supply path is detected after a prescribed number of wafers is processed.

* * * * *